United States Patent [19]

Frankenthal et al.

[11] Patent Number: 5,381,701
[45] Date of Patent: Jan. 17, 1995

[54] DUST PARTICLE EXPOSURE CHAMBER

[75] Inventors: Robert P. Frankenthal, Summit; David J. Siconolfi, New Providence; James D. Sinclair, Summit, all of N.J.

[73] Assignee: AT&T Corp., Murray Hill, N.J.

[21] Appl. No.: 37,802

[22] Filed: Mar. 26, 1993

[51] Int. Cl.⁶ ............................................. G01N 17/00
[52] U.S. Cl. ................................................. 73/865.6
[58] Field of Search .............. 73/1 G, 865.6, 865.8, 73/865.9; 324/158 F

[56] References Cited

U.S. PATENT DOCUMENTS

| 1,827,530 | 10/1931 | Grand | 73/865.6 |
| 2,346,690 | 4/1944 | Larkins, Jr. | 73/865.6 |
| 4,799,390 | 1/1989 | Kimura | 73/865.6 |

OTHER PUBLICATIONS

R. B. Comizzoli, et al., "Corrosion of Electronic Materials and Devices", *Science*, vol. 234, pp. 340–345 (1986).
EIA Standard RS-364-50, "Fest Procedure #50 Sand Dust Test Procedure for Electrical Connectors", Electrical Industries Association, Washington, D.C. 1983.
Department of Defense, MIL-STD-810D, paragraph 510.2, Jul. 19, 1983.
Steenstrup, et al. "A Comparative Study of Inhibited Lubricants For Dry Circuits, Sliding Contacts", *Proc. 28th IEEE Holn. Conf.*, No. 59, p. 59 (1982).

Primary Examiner—Robert Raevis
Attorney, Agent, or Firm—Eileen D. Ferguson; Margaret A. Burke

[57] ABSTRACT

This invention is embodied in an apparatus for assessing the effects of controlled amounts of well-characterized ionic or other particles on the reliability of electronic components. The chamber includes a high efficiency filter that purifies the input air and a recirculating system which ensures substantially laminar, constant velocity air flow, controllable humidity, and steady state conditions throughout at least a portion of the chamber. Particles are introduced into the chamber from a particle generator through a series of output ports that ensure a uniform concentration of particles throughout at least a portion of the chamber. Substantially constant conditions are achieved by constantly introducing new particles into the chamber, withdrawing a continuous flow of particle-laden air from the chamber, removing essentially all the particles from the particle-laden air withdrawn from the chamber and introducing a continuous flow of filtered air into the chamber. Additionally provisions for monitoring particle concentrations and size distribution, for controlling the relative humidity in the chamber, and for carrying out electrical aging and testing can be incorporated.

12 Claims, 2 Drawing Sheets

FIG. 2

```
                    PURIFIED & FILTERED
                       AIR/NITROGEN
                            │
              ┌─────────────┼──────────┐
              │             ▼          │
              │          ┌────────┐    │
              │          │ HEATER │─52 │
              │          └────────┘    │
              │             │          │
┌──────────┐  ▼             ▼      ┌──────────┐   ┌──────────────┐
│ AQUEOUS  │ ┌──────────┐          │ DIFFUSION│   │   CHARGE     │
│   SALT   │→│ ATOMIZER │─────────→│  DRYER   │──→│ NEUTRALIZER  │──→
│ SOLUTION │ └──────────┘          └──────────┘   └──────────────┘
└──────────┘      │                     │                │
                  50                    54               56
```

FIG. 3

DUST PARTICLE EXPOSURE CHAMBER

FIELD OF THE INVENTION

This invention relates to particle exposure chambers, specifically chambers for testing specimens to various atmospheric conditions.

BACKGROUND OF THE INVENTION

The reliability of integrated circuits, discrete devices, connectors, printed wiring boards, backplane wiring systems, etc. is strongly influenced by theft environment. The harmful effects of moisture and contamination on electronic devices and assemblies are well documented. See R. B. Comizzoli, et al., "Corrosion of Electronic Materials and Devices" Science, Vol. 234, pg. 340–345 (1986). Contamination may be introduced during manufacturing, or it may be deposited from the ambient environment during use. Of concern is a 10–100 fold increase in the deposition rate of fine particles on critical component surfaces due to forced-air cooling, necessitated by the greater power densities found in many present-day devices and assemblies.

Atmospheric particles of concern typically exhibit a bimodal mass distribution over the size range of approximately 0.01–15 $\mu$m in diameter. Particles larger than 15 $\mu$m are usually removed by filtration systems. Coarse particles (about 1–15 82 m), which are likely to be rich in calcium and are derived principally from mechanical processes, are typically removed with approximately 95% efficiency by standard air filtration systems. However, line particles (about 0.05–1 $\mu$m), which are likely to be rich in ammonium sulfate and other corrosive substances derived from fossil fuel combustion and natural processes, are difficult to remove by filtration and constitute the bulk of particles transferred indoors from the outdoor environment.

Fine particles are a significant corrosion hazard to most electronic devices because of their great ionic content. These particles tend to adsorb moisture from the environment, thereby forming an electrolyte. In the presence of an applied potential, leakage currents are set up and fault-producing electrolytic corrosion takes place. Ionic contamination of electronic devices, subassemblies and assemblies (collectively "components") from fine particles is an increasing cause of equipment failures.

While numerous chambers exist for life testing of electronic components and devices in the presence of gaseous contaminants, only a few have been described for testing with dust particles. See, EIA Standard RS-364-50, "Test Procedure #50 Sand Dust Test Procedure for Electrical Connectors," Electrical Industries Association, Washington, D.C., 1983. The few existing dust exposure chambers are designed to evaluate the effects of coarse particles (typically greater than 1 $\mu$m). The air flow in prior art chambers is typically either turbulent or undefined, particle dispersion typically is accomplished by mechanical injection into a high velocity air stream, and particle concentration and deposition rate vary widely across the chamber volume. In view of the increased incidence of failures caused by fine ionic particles (typically <1 $\mu$m), means for realistically testing electronic components with regard to their ability to perform in a particle-laden atmosphere are needed for assessing and ensuring the reliability of, e.g., new circuit boards, connectors, hybrid integrated circuits, multichip modules, and the cabinets that house these components. Such means am described in this application.

SUMMARY OF THE INVENTION

The present invention is embodied in an apparatus for assessing the effects of controlled amounts of well-characterized particles on the reliability of electronic components. In a preferred embodiment the apparatus comprises a chamber for holding specimens to be tested, a particle generator which can generate particles of the desired size (e.g., having a diameter less than 1 $\mu$m), a particle monitoring system for ensuring that particle concentrations and size distributions meet test specifications, means for uniformly distributing the particles generated by the particle generator into the chamber, recirculating means to withdraw a continuous flow of particle-laden air from the chamber and introduce a continuous, substantially laminar, flow of filtered air at substantially constant velocity into the chamber, a filtration system for purifying and removing essentially all the particles from the particle-laden air withdrawn from the chamber by the recirculating means, a humidity control apparatus for maintaining a fixed humidity or for varying humidity in an operator specified manner, and an electrical test apparatus and feed-throughs for conducting in-situ electrical aging studies and monitoring circuit degradations. Constant conditions in the chamber are achieved by recirculating and filtering the air, while constantly introducing new particles via the uniform distribution system.

BRIEF DESCRIPTION OF THE DRAWINGS

FIG. 2 schematically illustrates the particle generation system for the exposure apparatus in accordance with this invention.

FIG. 3 schematically illustrates the distribution system of the apparatus in accordance with this invention.

DETAILED DESCRIPTION

Figure 1:
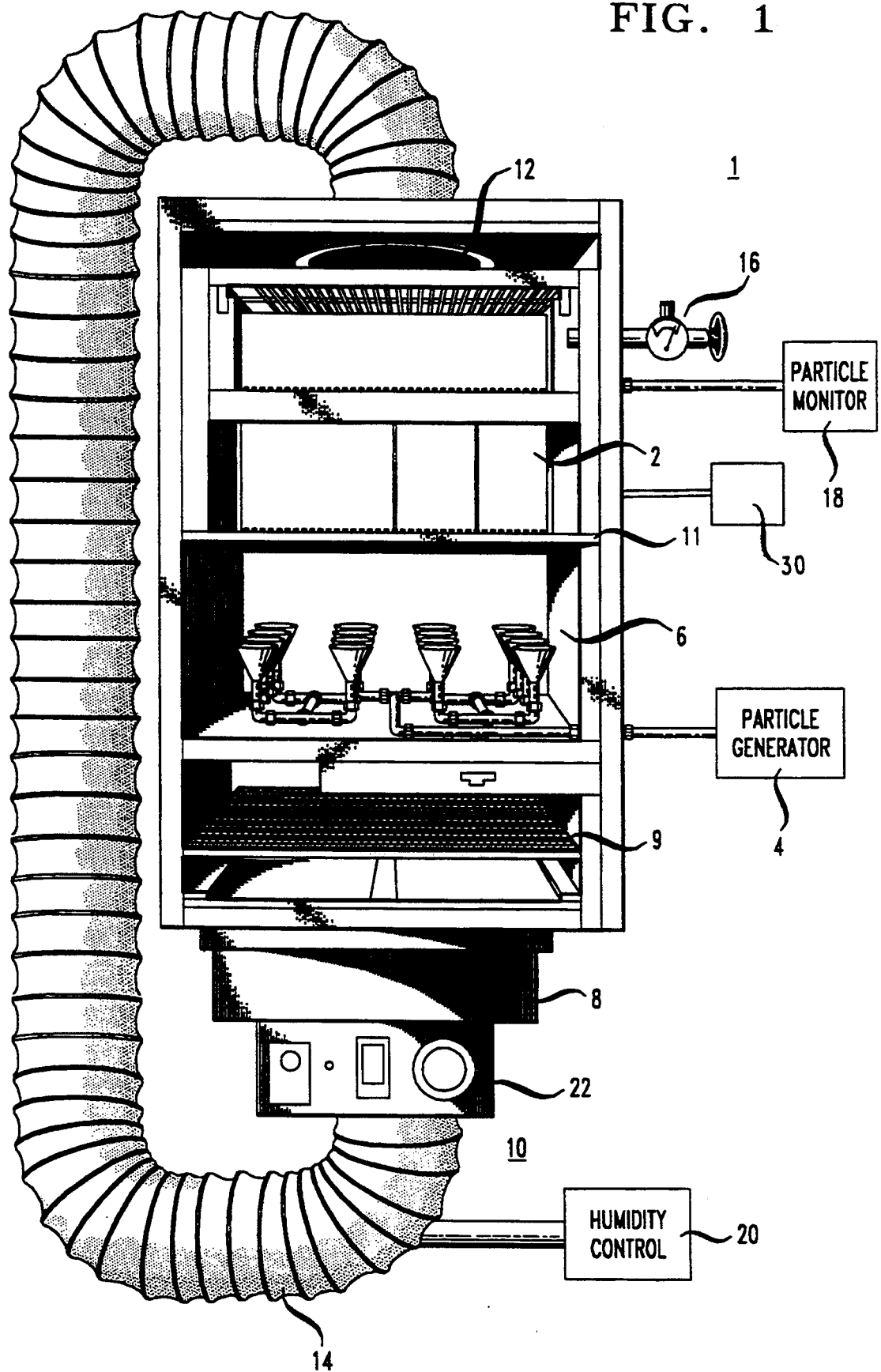
FIG. 1 is a cut-away view of exemplary exposure apparatus in accordance with this invention.

Referring to FIG. 1, there is shown an exemplary exposure apparatus 1 for assessing the effects of controlled amounts of well-characterized particles on the reliability of electronic devices and assemblies. The apparatus 1 is comprised of a chamber 2 with means for holding specimens to be tested, a particle generator 4 which exemplarily can generate particles in the size range of 0.01 to 1 $\mu$m, a distribution system 6 for substantially uniformly distributing the particles generated by the particle generator 4 into the chamber 2, recirculating means 10 for withdrawing a continuous flow of particle-laden air from the chamber 2 and introducing a continuous, substantially laminar flow of filtered air into chamber 2. Means 10 comprise filtration means 8 for removing essentially all of the particles from the particle-laden air withdrawn from the chamber 2, blower 22 and duct 14. The exemplary apparatus further comprises a humidity control means 20, a particle monitor 18 and electrical feed-throughs (not shown) for connecting electronic aging and test equipment to the components being tested.

Typically, submicron (0.01–1 $\mu$m) ionic particles, such as ammonium sulfate, are generated by the particle generator 4, such as a TSI, Constant Output Atomizer, Model 3076. (TSI is located in St. Paul, Minn.). Referring to FIG. 2, exemplarily, aerosol droplets are generated from an aqueous solution of salt and compressed, high-purity, filtered air which are combined in an atomizer 50. Alternatively, liquid dispersions of solids (e.g. polystyrene, diamond), may be used to generate aerosols. Aerosol droplets from the atomizer 50 are dried by a stream of pre-heated air 52. Additional residual moisture is then removed from the particles by passing the particles through a diffusion dryer 54. Since many of the particles are charged when they exit the atomizer 50, if desired, the particles can be neutralized with a charge neutralizer 56, such as a Kr-85 source, which brings the particles to a Boltzmann charge equilibrium. Alternatively, if the charge neutralizer is omitted, enhanced particle deposition will occur on charged surfaces on the device being tested. Typically, for a given particle generator 4, the size distribution of aerosol droplets is constant. Typically the indoor concentration of particles of size in the relevant range is of the order of $10^8/m^3$. Thus, the typical concentration of particles desired in the chamber is, e.g., approximately $10^9/m^3$ to achieve an acceleration factor for particle deposition of approximately 10. A particle monitoring system 18, such as a TSI, Electrical Aerosol Analyzing System, Model #EAA30, can be attached to the chamber to ensure that the particle concentration and size distribution meet the desired test specifications.

The particles enter into the chamber through a distribution system 6 that exemplarily is located in the lower part of the chamber, and travel with the filtered air provided by the recirculating means 10, as shown in FIG. 1. The distribution system 6 is designed to inject a substantially uniform concentration of particles into the chamber. This is achieved by having all the particles travel along similar paths, encounter the same or similar obstructions, turns, etc. and travel substantially the same distances. As shown in FIG. 3 the particles leave the generator 4 via a single path 70. The first path 70 is then divided, creating second and third paths 72 and 74 which are essentially of equal length. Then the second and third paths 72 and 74 are again divided, creating fourth and fifth paths 76 and 78 from the second path 72, and sixth and seventh paths 80 and 82 from the third path 74. The last section of each path terminates into an output port 84. Each of these paths, are of essentially equal length and have the same number and type of flow restrictions. Such paths are herein referred to as "nominally identical paths". The number of nominally identical paths is determined by the number of output ports 84 which are needed to provide a desired concentration level and concentration uniformity for a given size chamber. For example, to maintain a particle concentration of $3 \times 10^9/m^3$ in a chamber which has a cross section of approximately $0.6 \times 0.6$ m and a height of 1.1 m, it is estimated that sixteen output ports 84 are needed in the distribution system 6.

At the end of each output port 84 is a funnel 86. The use of funnels 86 at the end of the output ports 84 is a convenient but not exclusive method for improving the uniformity of the distribution of the particles in the chamber. The dimensions of the distribution system 6 are optimized to fit the cross-section of the chamber. Typically, the number of output ports also depends on the inner dimensions of the chamber. For the chamber shown in FIG. 1, with 16 ports uniformly distributed over an area of 0.6 by 0.6 m, each port distributes particle laden air over a horizontal area of approximately $0.02 \, m^2$. The optimum dimensions of the distribution system depend on the dimensions of the funnels and the air-flow rate. For example, the funnels in the above described chamber have a radius of approximately 0.035 m and a cone height of approximately 0.045 m. A typical rate of flow of particles from the distribution system is approximately $10^9$/min and is based on the rate of flow of the carrier gas, which exemplarily is approximately $10^{-2} m^3$/min.

The distribution system 6 can be made from any material which is chemically inert to the particle stream and which provides a smooth interior surface. For example, type 316 stainless steel, with relevant surfaces electropolished to minimize particle deposition and shedding of contaminants from its surface, has been used.

After leaving the distribution system 6, the particles travel with the filtered air provided by the recirculating means 10, through the chamber. Particles which have not deposited onto the specimens pass through an opening 12 in the chamber which is in line with the distribution system 6. The particle-laden air then passes through a duct 14, through blowing apparatus 22 to filtration system 8, which desirably removes essentially all the particles from the particle-laden air. The filtration system 8 comprises of a filter, e.g., an ultra low penetration air (ULPA) filter which filters 0.12 $\mu$m particles at 99.9995% efficiency. Above the ULPA filter is a diffusion screen 9 which improves the uniformity of the air flow into the chamber. In combination, the blowing apparatus 22, the filtration system 8 and the diffusion screen 9 ensure that the air flow in the chamber is substantially laminar and parallel to the vertical walls of the chamber and flows at the same velocity throughout the chamber, at least when the chamber does not contain any test specimens. Typically, the air flow velocity in the chamber is 30 m/min or greater, typical of conditions found in many forced-air cooled equipment frames.

It should be noted that the parallel air flow may be disrupted when test specimens are placed in the chamber e.g., onto equipment racks 11. Parallel air flow will typically be maintained in the region of the chamber below the test area, ensuring that the opportunity for particle deposition is substantially uniform for all of the specimens. For testing specimens that are much smaller than the cross sectional dimensions of the chamber, it may be advantageous to block or inhibit air flow around the sides of the test piece to increase the air velocity and particle deposition rate.

As a result of the continuous introduction of particles and the recirculating of the air, the pressure in the chamber increases. Thus a valve 16 located in the chamber releases pressure which builds up in the chamber. A pressure only slightly above atmospheric pressure will frequently be desirable. The relative humidity of the air in the chamber can be controlled by optional humidity control apparatus 20 which typically is incorporated into the recirculation system 10. The relative humidity can be reduced by a cooling coil and increased by a reservoir of water heated to the appropriate dewpoint.

Additionally, provisions for making electrical contact to the components being tested can be provided in the chamber (not shown). Contact may be made to test components under an applied voltage or to measure changes in the components' electrical properties, e.g., resistance, during the environmental exposure in chamber.

The operation of the exposure apparatus 1 begins with the placement of the test specimens into the chamber. Typically the specimens are held by racks 11, though many other fixtures are possible. In an exposure apparatus 1 that has a chamber having a cross section of approximately 60×60 cm and a height of 110 cm, approximately 48 circuit boards (14×8 inches in size) can be simultaneously tested. The size of the chamber can be designed to accommodate as many circuit boards or other specimens as needed, as long as the particle distribution system is adjusted accordingly, as described above. Typically, after the specimens are put in the chamber, the particle generation system 4 is activated. From a salt solution of 0.01-1M, the particle generator 4 typically produces $(NH_4)_2SO_4$ particles in the range of 0.01 to 1 $\mu$m. For a chamber of the above-recited size, with 16 output ports 84 and a constant air velocity of approximately 30 m/min, the average concentration of particles in the chamber under these conditions would be approximately $1 \times 10^{10}$ particles/m$^3$, with an exemplary mass concentration of approximately 10-20 $\mu$g/m$^3$. This is approximately ten times more than the indoor concentration of particles typically seen in the air where electronic equipment is typically located.

An increase or decrease of the particle deposition rate can be accomplished by varying the air flow velocity and/or the particle concentration. Particle concentration can be increased by reducing the flow rate of the preheated air 52, or by using additional atomizers 50, which also is a means of blending particles of different compositions. Concentrations can also be increased by using other known chemical or physical methods for generating particles. Particle concentration can be decreased by using a standard dilution system. Fresh particles are continuously introduced into the chamber, while undeposited particles are continuously filtered out. In this way, gradual shifts in the size distribution that would otherwise occur upon aging due to particle agglomeration are avoided.

Although the apparatus according to the invention has been described in terms appropriate to the testing of electronic components and/or assemblies, the apparatus may well find use in other fields such as studies of health effects of submicron particles, studies of mechanical pans, studies of particle exposure on vegetation, and corrosion of materials and all such applications are contemplated.

We claim:

1. A particle exposure apparatus comprising:
   a chamber having a member for holding at least one test specimen;
   a particle generator for generating particles, the particle generator including an atomizer for generating substantially uniform aerosol droplets;
   a gas flow generator having associated therewith a gas flow direction;
   output ports communicating with the particle generator through a particle distribution system comprising a plurality of paths, the output ports being substantially uniformly distributed in a plane normal to the gas flow direction and each of the plurality of particle distribution system paths being of similar length such that the particle concentration is substantially uniform over a chamber cross-section that is approximately normal to the gas flow direction: and
   a recirculation system including a duct through which exiting particle-laden gas passes, a filter for removing particles from the particle-laden air, and a reintroduction member for reintroducing gas into the chamber after passage through the filter.

2. A particle exposure apparatus according to claim 1 wherein the particle generator produces submicron particles having a uniform size distribution.

3. A particle exposure apparatus according to claim 1 wherein the particle generator includes a diffusion dryer positioned between the atomizer and the particle distribution system for removing moisture form the aerosol droplets.

4. A particle exposure apparatus according to claim 1 wherein the particle generator includes a charge neutralizer positioned between the atomizer and the particle distribution system.

5. A particle exposure apparatus according to claim 1 further comprising a particle monitoring system communicating with the apparatus interior.

6. A particle exposure apparatus according to claim 5 further comprising a humidity controller communicating with the apparatus interior.

7. A particle exposure apparatus according to claim 1 further comprising a pressure relief valve communicating with the apparatus interior.

8. A particle exposure apparatus according to claim 1 further comprising a test specimen monitoring system communicating with the chamber interior for contacting test specimens.

9. A particle exposure apparatus according to claim 1 wherein the recirculation system includes a blowing apparatus which provides parallel airflow at substantially constant velocity in at least a portion of the chamber.

10. A particle exposure apparatus according to claim 1 wherein each of the plurality of paths of the particle distribution system has the same number of turns.

11. A particle exposure apparatus comprising:
    a chamber having a member for holding at least one test specimen;
    a particle generator for generating submicron particles;
    a gas flow generator having associated therewith a gas flow direction;
    output ports communicating with the particle generator through a particle distribution system comprising a plurality of paths, the output ports being substantially uniformly distributed in a plane normal to the gas flow direction and each of the plurality of particle distribution system paths being of similar length such that the particle concentration is substantially uniform over a chamber cross-section that is approximately normal to the gas flow direction; and
    a recirculation system including a duct through which exiting particle-laden gas passes, a filter for removing particles from the particle-laden air, and a reintroduction member for reintroducing gas into the chamber after passage through the filter.

12. A method for testing electrical equipment comprising:
    providing the particle exposure apparatus of claim 11;
    exposing electrical equipment positioned within the particle exposure apparatus to uniformly distributed submicron particles; and
    measuring the electrical characteristics of the exposed electrical equipment.

* * * * *